US009872395B2

United States Patent
Yamada et al.

(10) Patent No.: US 9,872,395 B2
(45) Date of Patent: Jan. 16, 2018

(54) COMPONENT CRIMPING APPARATUS

(71) Applicant: Panasonic Intellectual Property Management Co., Ltd., Osaka (JP)

(72) Inventors: Akira Yamada, Yamanashi (JP); Shinjiro Tsuji, Yamanashi (JP); Satoshi Adachi, Yamanashi (JP); Yasutaka Tsuboi, Yamanashi (JP); Toshihiko Tsujikawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 219 days.

(21) Appl. No.: 14/804,760

(22) Filed: Jul. 21, 2015

(65) Prior Publication Data

US 2016/0052197 A1 Feb. 25, 2016

(30) Foreign Application Priority Data

Aug. 20, 2014 (JP) ................. 2014-167102

(51) Int. Cl.
*F16B 11/00* (2006.01)
*H05K 3/32* (2006.01)

(52) U.S. Cl.
CPC ............ *H05K 3/321* (2013.01); *F16B 11/006* (2013.01)

(58) Field of Classification Search
CPC ................. F16B 11/006; H05K 3/321; H01L 2021/6003; H01L 2021/60277; H01L 2021/60112; H01L 2021/60
See application file for complete search history.

(56) References Cited

U.S. PATENT DOCUMENTS

| 8,366,864 B2 * | 2/2013 | Morimoto ......... H01L 21/67092 156/297 |
| 2010/0243153 A1 * | 9/2010 | Onitsuka ................. H01L 24/79 156/290 |
| 2015/0096687 A1 * | 4/2015 | Tsuboi .................... H05K 13/08 156/378 |

FOREIGN PATENT DOCUMENTS

| JP | H04-359441 A | 12/1992 |
| JP | H06-120465 A | 4/1994 |
| JP | 9-69543 A | 3/1997 |
| JP | H11-067839 A | 3/1999 |
| JP | 2011066189 A * | 3/2011 |

* cited by examiner

*Primary Examiner* — Robert B Davis
(74) *Attorney, Agent, or Firm* — Pearne & Gordon LLP

(57) ABSTRACT

A component crimping apparatus includes: a substrate holding part that holds a substrate of a transparent material, a component previously attached to each electrode of electrodes juxtaposed in an edge of the substrate through a photo-curable adhesive member; a supporting part that supports, by a transparent member, a region under the electrodes in the substrate; crimping tools that are juxtaposed over the transparent member and press the components to the substrate; and a light irradiating part that irradiates the adhesive member with light through the transparent member when the crimping tools press the components to the substrate. The crimping tools are configured movably in an arrangement direction of the crimping tools, the transparent member has a dimension capable of covering a whole region of a movable range of the crimping tools, and the light irradiating part irradiates a whole region of the transparent member with the light.

1 Claim, 10 Drawing Sheets

COMPONENT CRIMPING APPARATUS

CROSS-REFERENCES TO RELATED APPLICATION(S)

This application is based on and claims priority from Japanese Patent Application No. 2014-167102 filed on Aug. 20, 2014, the entire contents of which are incorporated herein by reference.

BACKGROUND

1. Field of the Invention

One or more embodiments of the present invention relate to a component crimping apparatus for bonding a component to each of plural electrodes juxtaposed in an edge of a substrate through an adhesive member.

2. Description of Related Art

A component crimping apparatus is an apparatus for bonding components to plural electrodes formed in an edge of a substrate through adhesive members, and includes a supporting part for supporting a region under the electrodes in a region of a lower surface of the substrate, and a crimping tool arranged over the supporting part, and when the crimping tool presses the component to the substrate supported by the supporting part, the component is bonded to the substrate by bonding force of the adhesive member. In the case of forming plural sets of the crimping tools and the supporting parts, the plural components can be collectively crimped regardless of an arrangement pitch of the components by matching arrangement pitches of the crimping tools and the supporting parts with the arrangement pitch of the components on the substrate. When the number of components to be crimped to the substrate is larger than the number of crimping tools, all the components cannot be crimped in one crimping operation. With the result that in this case, plural crimping operations, each operation for a part of the plural electrodes are performed while shifting positions of the electrodes with respect to the crimping tools.

On the other hand, some component crimping apparatuses use a photo-curable adhesive member (see, for instance, Patent Reference 1 described below). In this type of component crimping apparatus, each supporting part supports a region under an electrode by a transparent member. Then, when a crimping tool presses a component to a substrate, a light irradiating part irradiates the adhesive member with light from the lower surface side of the substrate through the transparent member. Since this irradiation photocures the adhesive member, the component can be bonded at a temperature lower than normal. In the component crimping apparatus using such a photo-curable adhesive member, as well as the crimping tool and the supporting part, the light irradiating part has a configuration movable in its arrangement direction and thereby, the components can be collectively crimped regardless of the arrangement pitch of the components.

Patent Reference 1 is JP-A-9-69543.

SUMMARY

However, in the component crimping apparatus using the photo-curable adhesive member, a width dimension of the light irradiating part in a movement direction is larger than a width dimension of the crimping tool in a movement direction, and a minimum arrangement pitch of the light irradiating parts is larger than a minimum arrangement pitch of the crimping tools. As a result, a minimum arrangement pitch of the components capable of being collectively crimped is limited by the size of the light irradiating part, and improvement in work efficiency is inhibited.

Hence, an object of the embodiments of the invention is to provide a component crimping apparatus capable of implementing component crimping with high flexibility according to an arrangement pitch of components and improving work efficiency.

According to an embodiment of the invention, there is provided a component crimping apparatus including: a substrate holding part that holds a substrate of a transparent material, a component previously attached to each electrode of a plurality of electrodes juxtaposed in an edge of the substrate through a photo-curable adhesive member; a supporting part that supports, by a transparent member, a region under the plurality of electrodes in a lower surface of the substrate held by the substrate holding part; a plurality of crimping tools that are juxtaposed over the transparent member and press the components to the substrate whose lower surface is supported by the supporting part; and a light irradiating part that irradiates the adhesive member with light from a lower surface side of the substrate through the transparent member when the crimping tools press the components to the substrate, wherein the plurality of crimping tools are configured movably in a direction of arrangement of the plurality of crimping tools, the transparent member has a dimension capable of covering a whole region of a movable range of the plurality of crimping tools in the direction of arrangement, and the light irradiating part irradiates a whole region of the transparent member with the light.

One of embodiments of the invention can implement component crimping with high flexibility according to an arrangement pitch of the components and improve work efficiency.

DETAILED DESCRIPTION

Figure 1:
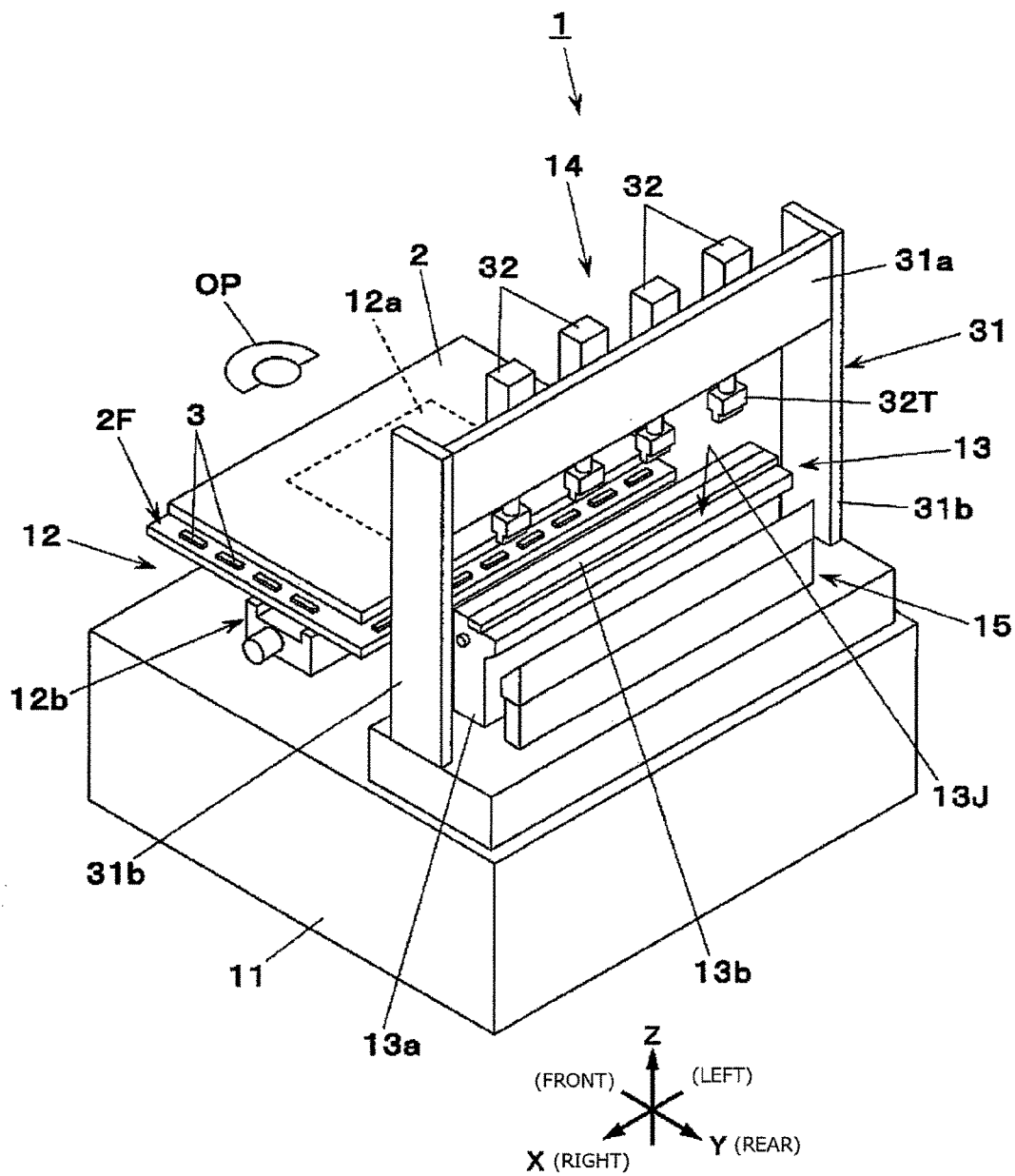
FIG. 1 is a perspective view of a component crimping apparatus in an embodiment of the invention.
Figure 2:
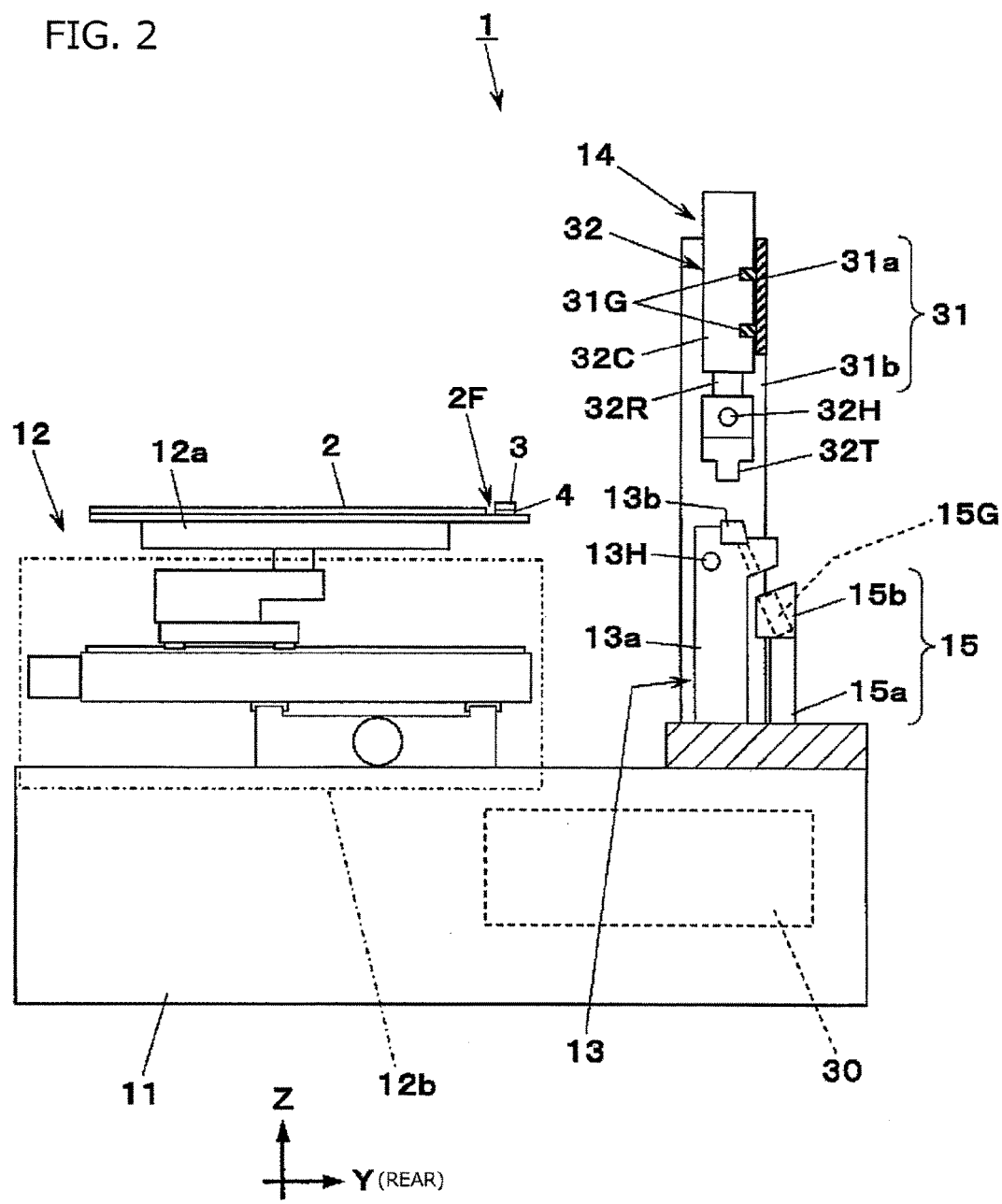
FIG. 2 is a side view of the component crimping apparatus in the embodiment of the invention.
Figure 3:
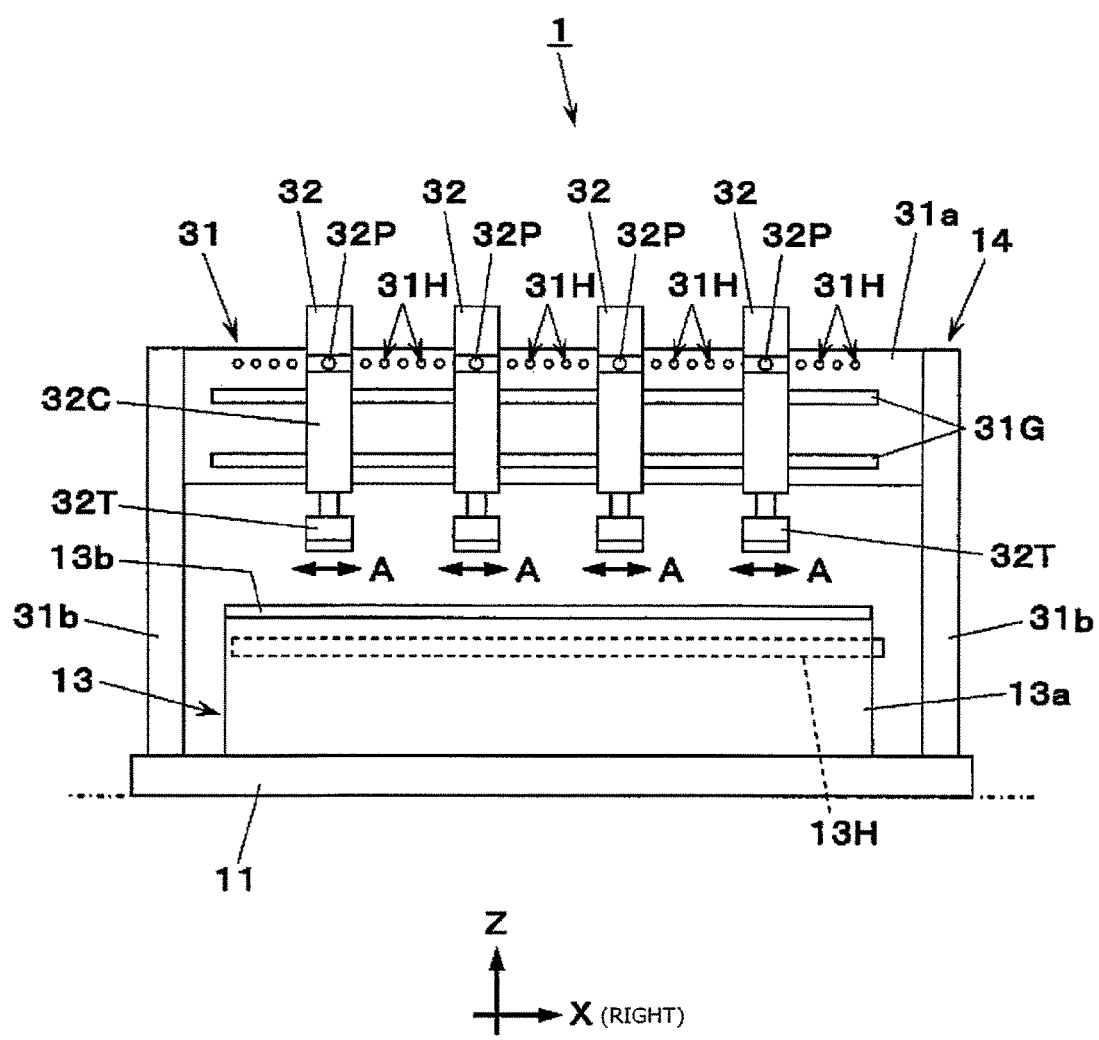
FIG. 3 is a partially front view of the component crimping apparatus in the embodiment of the invention.

An embodiment of the invention will hereinafter be described with reference to the drawings. FIGS. 1 to 3 show a component crimping apparatus 1 in the embodiment of the invention. The component crimping apparatus 1 is an apparatus that crimps plural components 3 previously attached (temporarily fixed) to an edge 2F of a substrate 2. The case where the component crimping apparatus 1 is used as a main crimping apparatus in a liquid crystal panel manufacturing system will herein be described by way of example.

Figure 4:
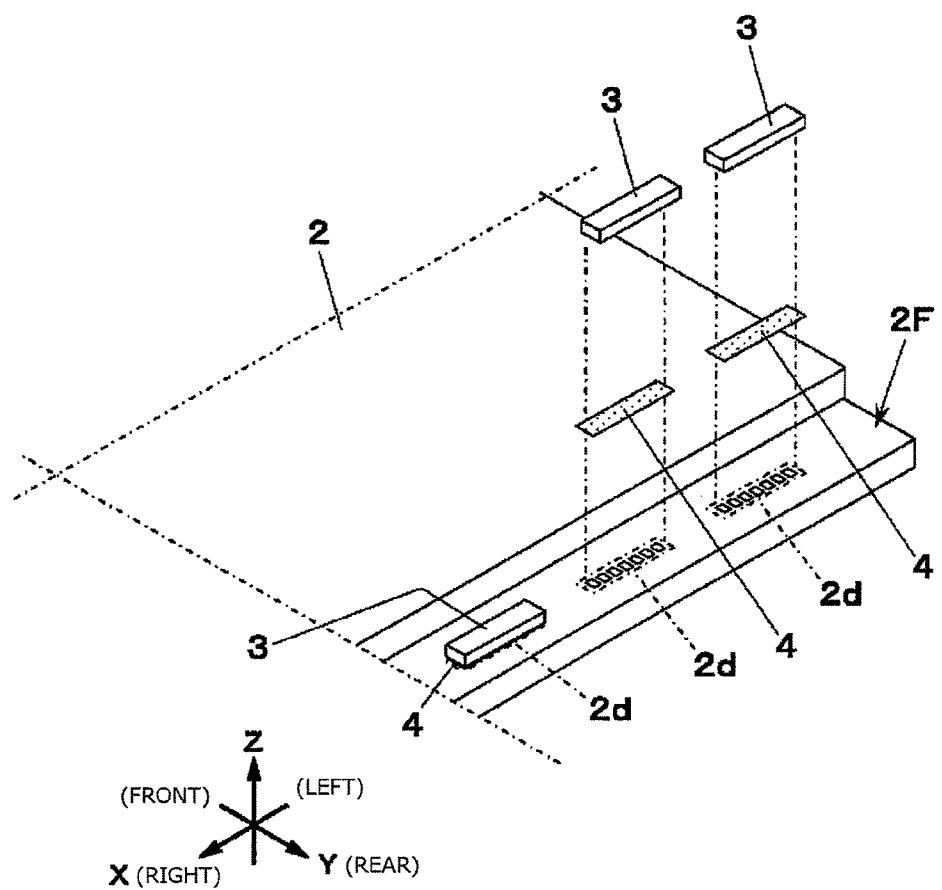
FIG. 4 is a partially exploded perspective view of a substrate which the component crimping apparatus in the embodiment of the invention targets for work.

The substrate 2 is made of a transparent material such as glass, and has a generally rectangular shape. Plural electrodes 2d are juxtaposed in each of the two orthogonal edges 2F in four sides included by the substrate 2 (FIG. 4). The component 3 such as an integrated circuit (driver IC) for driving is attached to each of the electrodes 2d through a tape-shaped photo-curable adhesive member 4 to be cured with irradiation with light such as ultraviolet rays. In the present embodiment, the eight components 3 are attached to one edge 2F (long side) of the substrate 2 at equal intervals, and the four components 3 are attached to the other edge 2F (short side) of the substrate 2 at equal intervals. The photo-curable adhesive member 4 is an adhesive that exerts bonding force at a temperature lower than normal by being photocured with the irradiation with light.

In FIGS. 1 to 3, the component crimping apparatus 1 includes a substrate holding movement part 12, a supporting part 13, a crimping part 14 and a light irradiating part 15 on a base 11. The substrate holding movement part 12 has a table-shaped substrate holding part 12a for holding a lower surface of the substrate 2 by vacuum suction etc., and a holding part movement mechanism 12b for moving the substrate holding part 12a. The holding part movement mechanism 12b freely moves the substrate holding part 12a in a left-right direction (X-axis direction), a front-rear direction (Y-axis direction) and a vertical direction (Z-axis direction) viewed from an operator OP.

In FIGS. 1 and 2, the supporting part 13 is formed in a rear region of the substrate holding movement part 12. The supporting part 13 has a base part 13a formed on the base 11 so as to extend in the X-axis direction, and a transparent member 13b formed on an upper surface 13J (also see FIG. 5) of the base part 13a.

Figure 5:
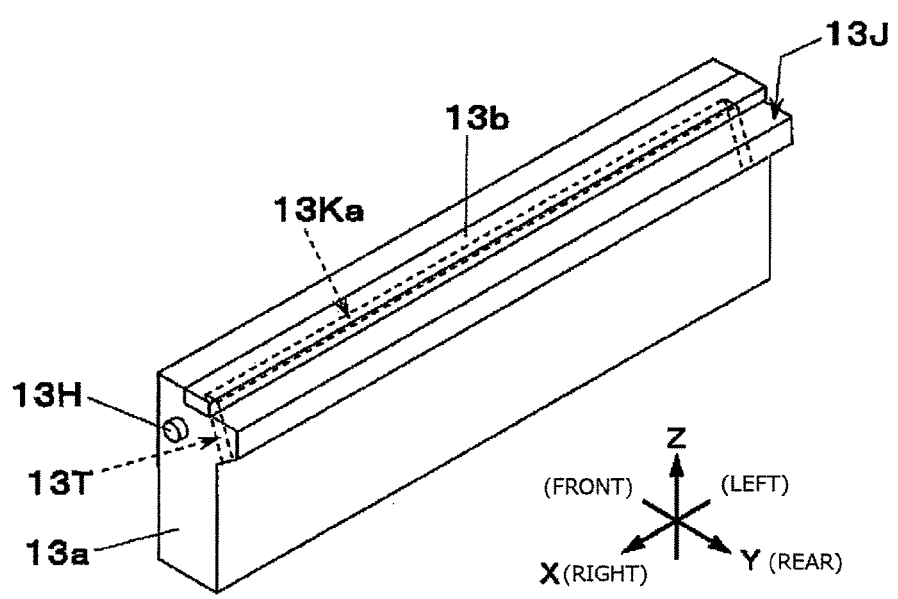
FIG. 5 is a perspective view of a supporting part included by the component crimping apparatus in the embodiment of the invention.
Figure 6:
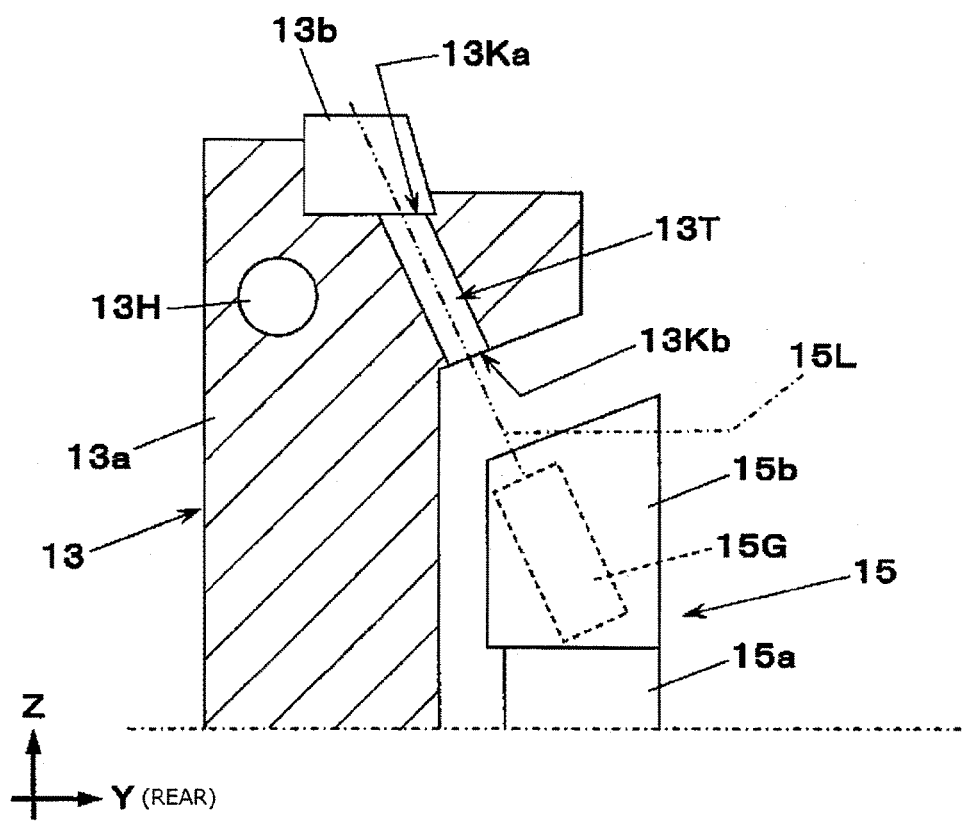
FIG. 6 is a partially enlarged side view of the component crimping apparatus in the embodiment of the invention.

In FIGS. 5 and 6, an optical path 13T obliquely extending from the rear toward the front upper side is throughly formed in an upper part of the base part 13a. An opening part (upper opening 13Ka) of the optical path 13T in the upper surface 13J of the base part 13a has a length of substantially the whole region of the upper surface 13J of the base part 13a in a width direction (X-axis direction), and an opening part (lower opening 13Kb) of the lower side of the optical path 13T also has the same width as that of the upper opening 13Ka.

The transparent member 13b is a long block-shaped member made of a transparent material such as glass. The transparent member 13b is formed so as to cover the optical path 13T in the upper surface 13J of the base part 13a, and has a dimension capable of covering the whole region of a movable range of four crimping tools 32T described below in a direction (X-axis direction) of arrangement of the crimping tools. The transparent member 13b is formed so as to cover the optical path 13T in the upper surface 13J of the base part 13a. An upper region of the base part 13a is provided with a lower heater 13H for uniformly heating the whole region of the transparent member 13b by heat generation operation.

In FIGS. 1 to 3, the crimping part 14 includes a portal frame 31 formed on the base 11, and plural (four herein) crimping cylinders 32 attached to the portal frame 31. The portal frame 31 includes a lateral bridge part 31a extending over the supporting part 13 in the X-axis direction, and two struts 31b for supporting both ends of the lateral bridge part 31a. The front of the lateral bridge part 31a is provided with a pair of upper and lower guides 31G extending in the X-axis direction.

In FIGS. 2 and 3, in each of the crimping cylinders 32, a cylinder tube 32C is attached to the pair of upper and lower guides 31G in a posture in which a piston rod 32R faces downwardly. The crimping tool 32T is attached to the lower end of the piston rod 32R of each of the crimping cylinders 32. And, each of the crimping cylinders 32 is constructed so that the cylinder tube 32C can be slid along the guides 31G in the X-axis direction (arrows A shown in FIG. 3) and the four crimping tools 32T can be moved in a direction (X-axis direction) of arrangement of the crimping tools 32T. An upper heater 32H is built into the crimping tool 32T of each of the crimping cylinders 32, and the crimping tool 32T is heated by heat generation operation. Each of the crimping tools 32T is located over the transparent member 13b included by the supporting part 13.

In FIG. 3, the front of the lateral bridge part 31a is provided with plural positioning holes 31H arranged in the X-axis direction. In a state in which one hole selected from these plural positioning holes 31H is matched with one hole (not shown) formed in the cylinder tube 32C of the crimping cylinder 32 in the front-rear direction, a pin 32P is inserted from the front side of the lateral bridge part 31a and thereby, the crimping cylinder 32 can be fixed to the lateral bridge part 31a. The four crimping cylinders 32 are positioned and fixed to the lateral bridge part 31a so that an arrangement pitch of the crimping tools 32T matches with a pitch according to the arrangement pitch of the components 3.

In FIGS. 1 and 2, the light irradiating part 15 is formed in a rear region of the supporting part 13. The light irradiating part 15 includes an irradiating part base 15a formed on the base 11 so as to extend in the X-axis direction, and an irradiating part body 15b formed on an upper part of the irradiating part base 15a. The irradiating part body 15b includes a light source 15G for emitting light 15L such as ultraviolet rays.

The light source 15G includes, for example, plural LED lamps (not shown) juxtaposed in the X-axis direction, and emits the light 15L with uniform intensity from the whole region in the X-axis direction toward the front upper side as a whole. In FIG. 6, the light 15L emitted to the front upper side by the light source 15G enters the optical path 13T from the lower opening 13Kb formed in the supporting part 13. The light 15L entering the optical path 13T passes through the transparent member 13b as it is, and reaches the adhesive member 4. Since the light irradiating part 15 applies the light 15L from the whole region in the X-axis direction herein, the whole region of the transparent member 13b is irradiated with the light.

Figure 7:
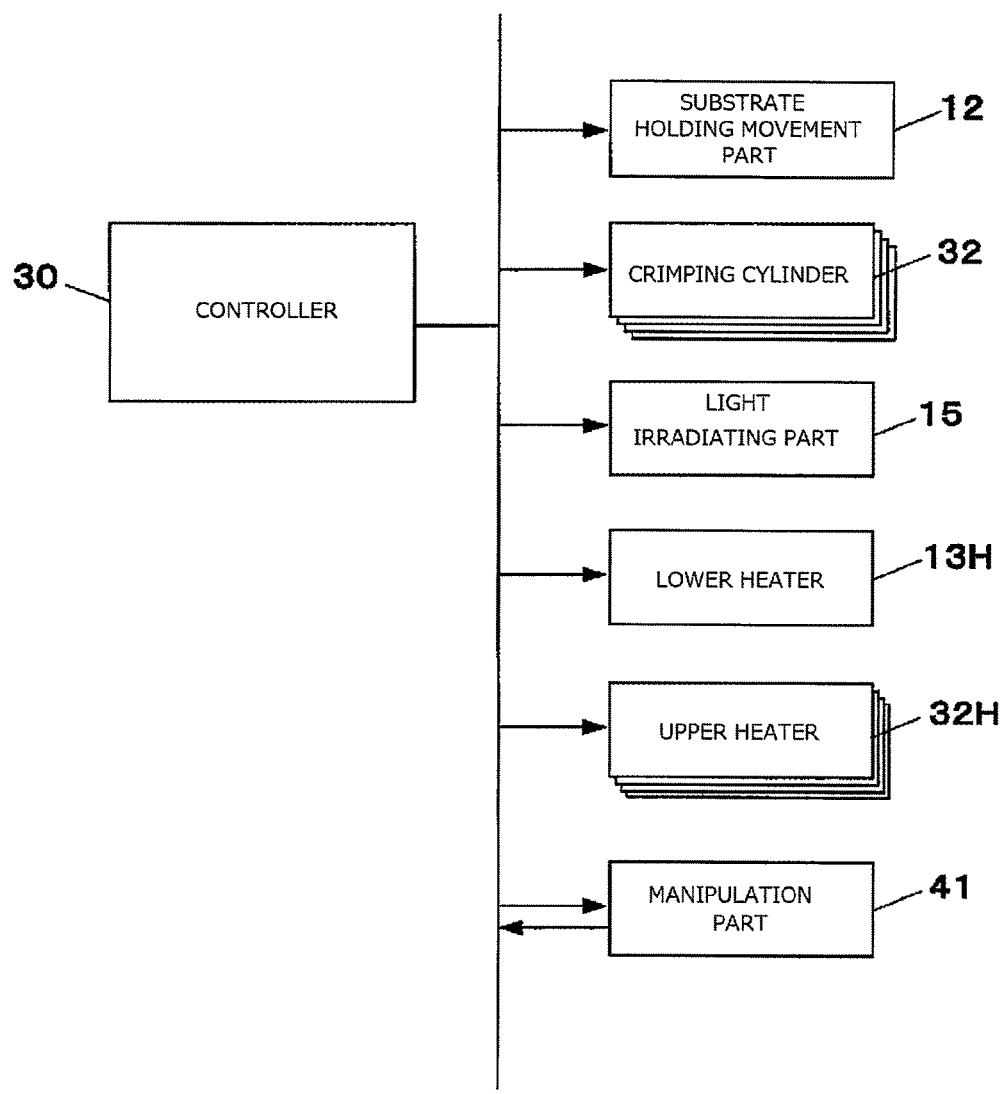
FIG. 7 is a block diagram showing a control system of the component crimping apparatus in the embodiment of the invention.

In FIG. 7, a controller 30 included by the component crimping apparatus 1 performs actuation control of the substrate holding movement part 12. Also, the controller 30 performs actuation control of each of the crimping cylinders 32, actuation control of the light irradiating part 15, the lower heater 13H and the upper heater 32H included by each of the crimping cylinders 32.

Next, work (component crimping work) of crimping the components 3 to the substrate 2 by the component crimping apparatus 1 will be described. Here, a procedure for crimping the eight components 3 attached to the edge 2F of the long side of the substrate 2 to the substrate 2 and then crimping the four components 3 attached to the edge 2F of the short side of the substrate 2 to the substrate 2 is shown.

All the eight components 3 attached to the edge 2F of the long side of the substrate 2 cannot be crimped in one collective crimping operation by the four crimping tools 32T. As a result, the eight components 3 are divided into two portions, and the four alternate components 3 (first crimping target) are first crimped and then, the other four components 3 (next crimping target) are crimped.

First, the operator OP makes preparation to crimp the components 3 of the first crimping target. Concretely, the crimping cylinders 32 are positioned so that the four crimping tools 32T become an arrangement pitch corresponding to an interval (two times the arrangement pitch of the components 3) of the four alternate components 3. After positioning of the crimping tools 32T is completed, the operator OP performs a predetermined input manipulation from a manipulation part 41 (FIG. 7) connected to the controller 30. The controller 30 that has received this input manipulation actuates the lower heater 13H and the upper heater 32H of each of the crimping tools 32T, and respectively increases temperatures of the transparent member 13b of the supporting part 13 and each of the crimping tools 32T to predetermined temperatures.

Figure 8A:
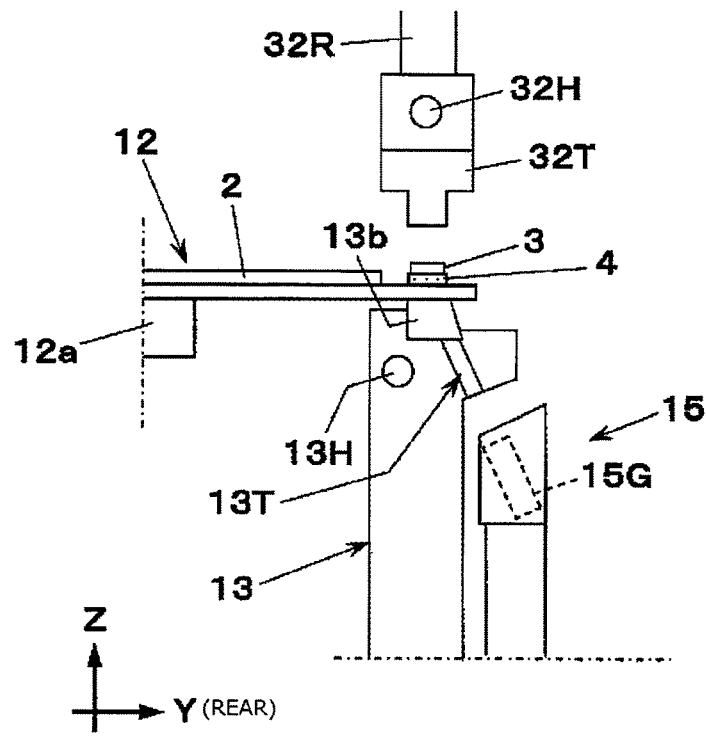
FIGS. 8A and 8B are operation explanatory diagrams of the component crimping apparatus in the embodiment of the invention.
Figure 9A:
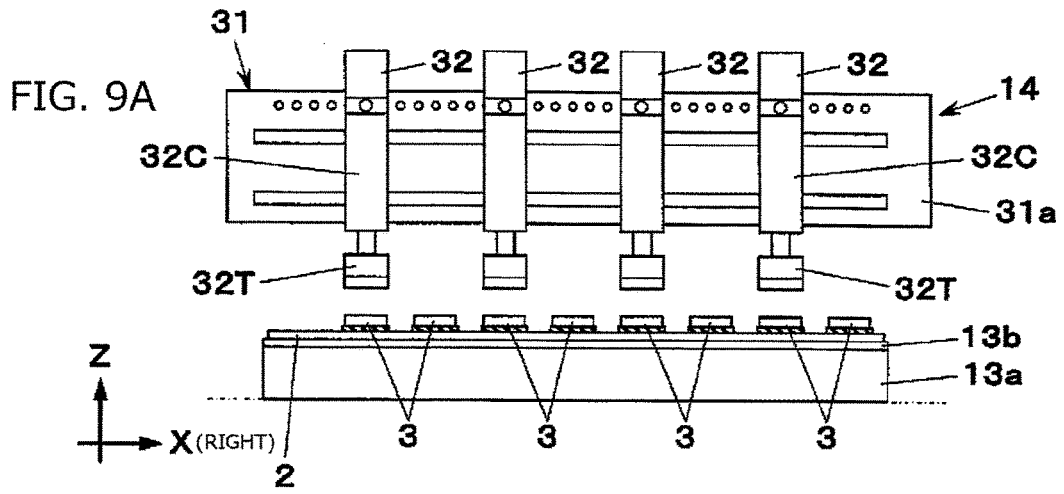
FIGS. 9A to 9C are operation explanatory diagrams of the component crimping apparatus in the embodiment of the invention.

After the temperatures of the transparent member 13b and each of the crimping tools 32T are respectively increased to the predetermined temperatures, a substrate conveyance apparatus (not shown) carries in the substrate 2, and the substrate holding part 12a receives and holds the substrate 2. Then, the holding part movement mechanism 12b of the substrate holding movement part 12 moves the substrate holding part 12a, and the four components 3 of the first crimping target are positioned under the four crimping tools 32T (FIG. 8A), and the four other components 3 (of the next crimping target) are positioned in positions deviating from the lower sides of the four crimping tools 32T (FIG. 9A). Accordingly, in the supporting part 13, the lower regions of the four electrodes 2d in the region of the lower surface of the substrate 2 held by the substrate holding part 12a become supported by the transparent member 13b.

After the four components 3 of the first crimping target are positioned under the four crimping tools 32T as described above, the four crimping cylinders 32 downwardly move the crimping tools 32T collectively. Accordingly, the four crimping tools 32T press the four components 3 of the crimping target to the substrate 2 (arrows B1 shown in FIGS. 8B and 9B). The crimping tools 32T press the components 3 to the substrate 2 held by the supporting part 13 in a heating environment in this manner and thereby, the components 3 are bonded to the substrate 2 (electrodes 2d) by the bonding forces of the adhesive members 4.

Figure 8B:
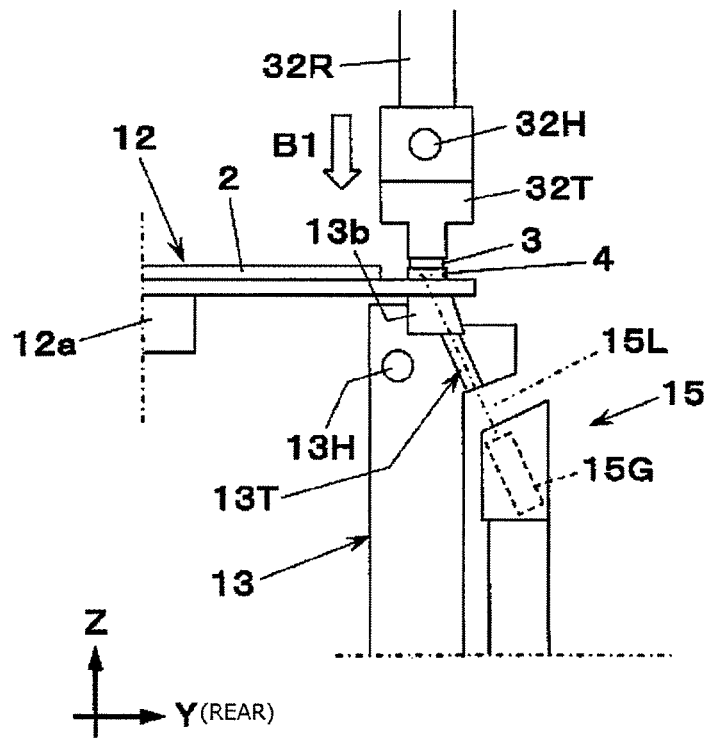
Figure 9B:
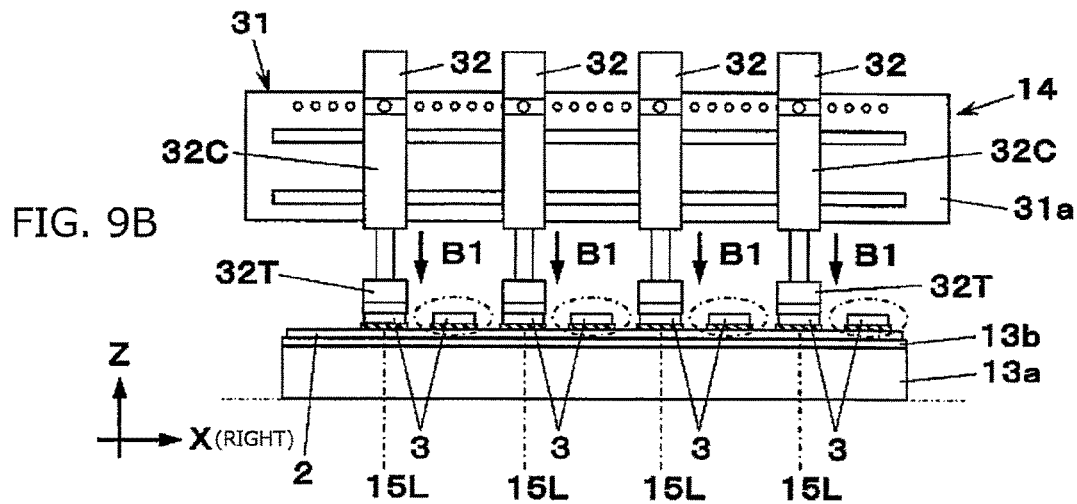

When the crimping tools 32T press the components 3 on the substrate 2 as described above, the light irradiating part 15 irradiates the inside of the optical path 13T with the light 15L from the lower opening 13Kb and thereby, each of the adhesive members 4 is irradiated with the light 15L from the lower surface side of the substrate 2 through the transparent member 13b connected to the optical path 13T (FIGS. 8B and 9B). When the light 15L incident on the optical path 13T reaches the adhesive members 4, the adhesive members 4 are photocured.

Thus, the component crimping apparatus 1 in the embodiment is constructed so that the transparent member 13b of the supporting part 13 has the dimension capable of covering the whole region of the movable range of the four crimping tools 32T in the direction of arrangement of the crimping tools 32T and the light irradiating part 15 for irradiating each of the adhesive members 4 with the light 15L irradiates the whole region of the transparent member 13b with the light 15L, with the result that the crimping tools 32T can be positioned in any position to crimp the components 3. As a result, collective crimping of the components 3 with high flexibility according to the arrangement pitch of the components 3 can be implemented.

Figure 9C:
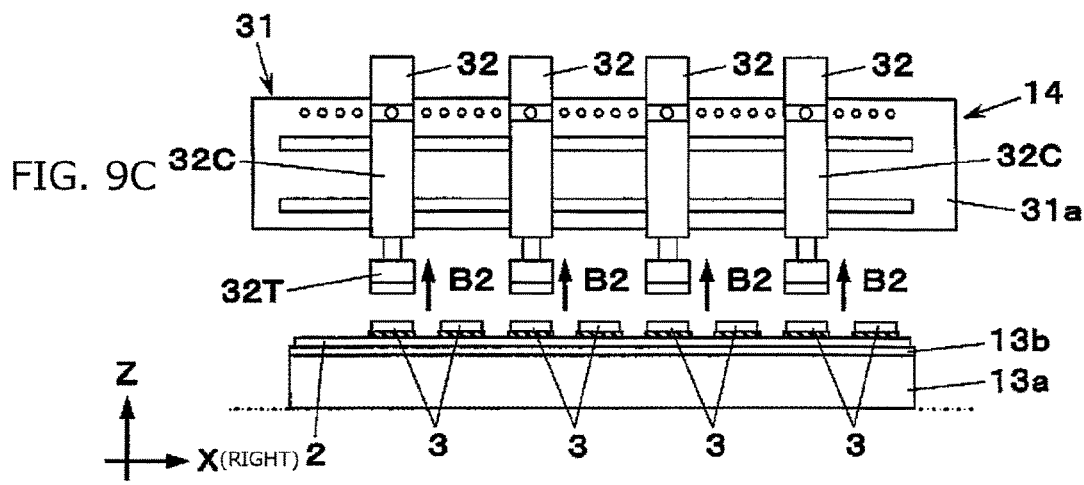
Figure 10A:
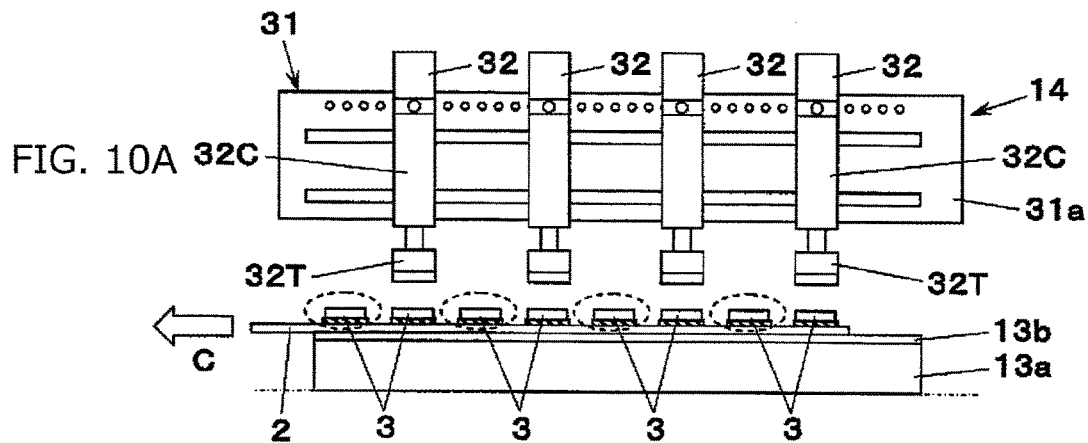
FIGS. 10A to 10C are operation explanatory diagrams of the component crimping apparatus in the embodiment of the invention.

After the four components 3 of the first crimping target are crimped to the electrodes 2d, the four crimping cylinders 32 upwardly move the crimping tools 32T (arrows B2 shown in FIG. 9C). Then, the holding part movement mechanism 12b moves the substrate holding part 12a (that is, the substrate 2) by the arrangement pitch of the components 3 in the X-axis direction (an arrow C shown in FIG. 10A). Accordingly, the four components 3 (components 3 surrounded by ellipses of broken lines in FIG. 10A) of the first crimping target already crimped to the electrodes 2d are positioned in positions deviating from the lower sides of the four crimping tools 32T and in turn, the four components 3 of the next crimping target are positioned under the four crimping tools 32T (FIG. 10A).

Figure 10B:
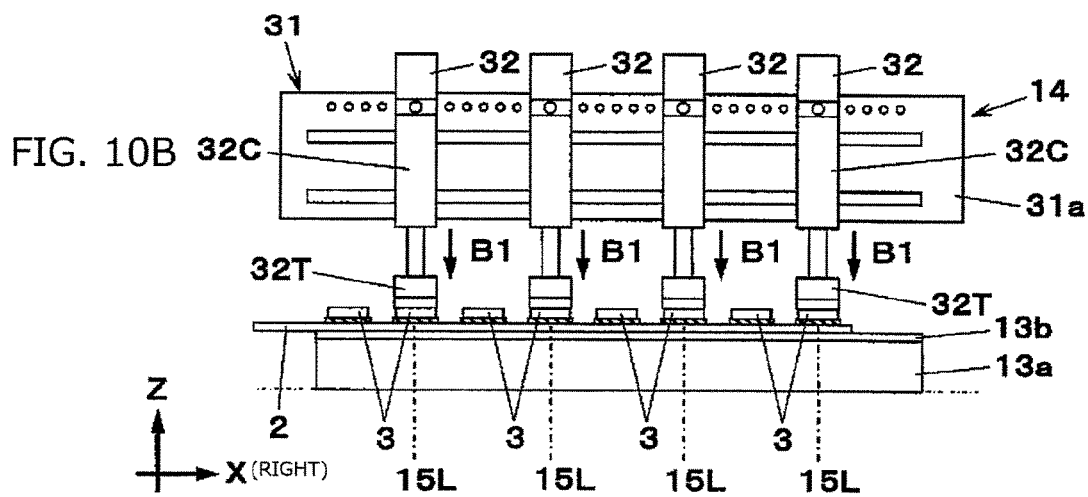

After the four components 3 of the next crimping target are positioned under the four crimping tools 32T as described above, the four crimping cylinders 32 are actuated and downwardly move the crimping tools 32T collectively, and press the four components 3 of the crimping target to the substrate 2 (arrows B1 shown in FIGS. 8B and 10B). Also, at this time, the light irradiating part 15 applies the light 15L (FIGS. 8B and 10B). Accordingly, the four components 3 of the next crimping target are crimped (permanently crimped) to the corresponding electrodes 2d.

Figure 10C:
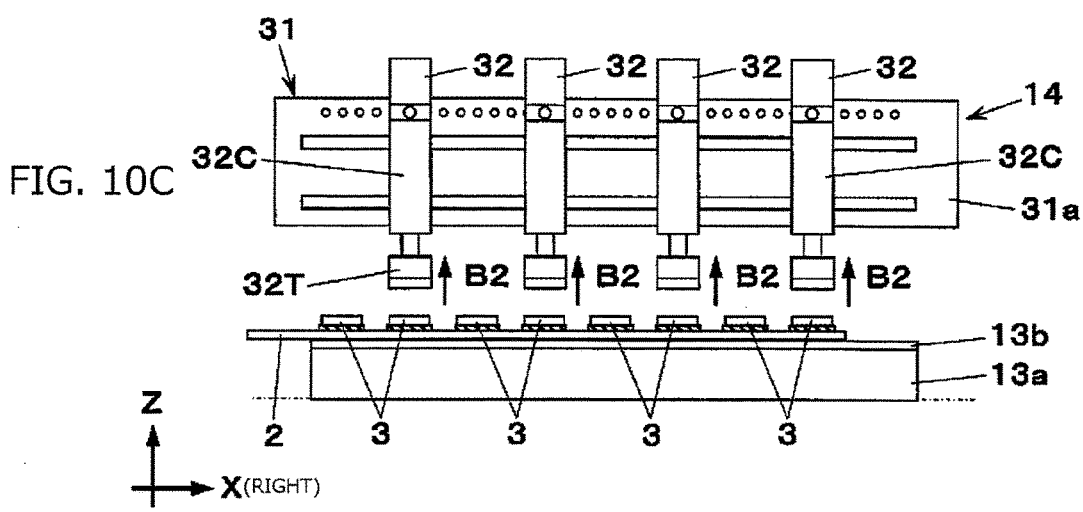

After the four components 3 of the next crimping target are crimped to the electrodes 2d, the four crimping cylinders 32 upwardly move the crimping tools 32T (arrows B2 shown in FIG. 10C). Then, the substrate holding movement part 12 retracts the edge 2F of the long side of the substrate 2 from the upper side of the supporting part 13. After the edge 2F of the substrate 2 is retracted, the operator OP then makes preparation to crimp the four components 3 attached to the edge 2F of the short side of the substrate 2 to the electrodes 2d of the substrate 2. Concretely, an arrangement pitch of the crimping tools 32T are adjusted at a pitch corresponding to an interval of the four components 3 attached to the edge 2F of the short side of the substrate 2. After the arrangement pitch of the crimping tools 32T are adjusted, the operator OP performs a predetermined input manipulation from the manipulation part 41. Accordingly, the substrate holding movement part 12 performs operation of rotating the substrate 2 by 90°, and the crimping cylinders 32 crimp the components 3 to the edge 2F of the short side of the substrate 2 by operation similar to the case of crimping the components 3 to the edge 2F of the long side of the substrate 2.

Since the number of components 3 is the same (four) as the number of crimping tools 32T in press attachment of the components 3 attached to the edge 2F of the short side of the substrate 2, collective operation of the four crimping tools 32T is performed only one time. After the four components 3 are crimped to the edge 2F of the short side of the substrate 2 in this way, the substrate holding movement part 12 retracts the edge 2F of the short side of the substrate 2 from the upper side of the supporting part 13. After the edge 2F of the substrate 2 is retracted, the substrate conveyance apparatus (not shown) receives the substrate 2 from the substrate holding part 12a, and carries out the substrate 2 to the outside of the component crimping apparatus 1.

As described above, the component crimping apparatus 1 in the embodiment is constructed so that the transparent member 13b of the supporting part 13 has the dimension capable of covering the whole region of the movable range of the four crimping tools 32T in the direction (X-axis direction) of arrangement of the crimping tools 32T and also the light irradiating part 15 for irradiating each of the adhesive members 4 with the light 15L irradiates the whole region of the transparent member 13b with the light 15L, with the result that the crimping tools 32T can be positioned in any position to crimp the components 3. As a result, collective crimping of the components 3 with high flexibility according to the arrangement pitch of the components 3 can be implemented to thereby improve work efficiency.

A component crimping apparatus capable of implementing collective crimping of components with high flexibility according to an arrangement pitch of the components and improving work efficiency is provided.

What is claimed is:

1. A component crimping apparatus comprising:
   a substrate holding part that holds a substrate of a transparent material, a component previously attached to each electrode of a plurality of electrodes juxtaposed in an edge of the substrate through a photo-curable adhesive member;
   a supporting part that supports, by a transparent member, a region under the plurality of electrodes in a lower surface of the substrate held by the substrate holding part;
   a plurality of crimping tools that are juxtaposed over the transparent member and press the components to the substrate whose lower surface is supported by the supporting part; and
   a light irradiating part that irradiates the adhesive member with light from a lower surface side of the substrate through the transparent member when the plurality of crimping tools press the components to the substrate, wherein
   the plurality of crimping tools are configured movably in a direction of arrangement of the plurality of crimping tools,
   the transparent member has a dimension capable of covering a whole region of a movable range of the plurality of crimping tools in the direction of arrangement, and
   the light irradiating part irradiates a whole region of the transparent member with the light.

* * * * *